United States Patent
Thallner

(10) Patent No.: US 8,118,290 B2
(45) Date of Patent: Feb. 21, 2012

(54) METHOD FOR HOLDING WAFERS AND DEVICE FOR FIXING TWO PARALLEL ARRANGED WAFERS RELATIVE TO ONE ANOTHER

(76) Inventor: Erich Thallner, St. Florian (AT)

( * ) Notice: Subject to any disclaimer, the term of this patent is extended or adjusted under 35 U.S.C. 154(b) by 1315 days.

(21) Appl. No.: 11/749,294

(22) Filed: May 16, 2007

(65) Prior Publication Data

US 2007/0292248 A1 Dec. 20, 2007

(30) Foreign Application Priority Data

Jun. 2, 2006 (DE) .......................... 10 2006 026 331

(51) Int. Cl.
*B25B 11/00* (2006.01)
*B65D 85/00* (2006.01)
*B65D 81/07* (2006.01)

(52) U.S. Cl. ......... 269/21; 269/46; 269/254 R; 206/710; 206/454; 206/509

(58) Field of Classification Search ............ 269/21, 269/43, 6, 903; 250/443.1, 455.11; 257/414; 29/25.01; 414/217.1, 941, 403; 427/208.4; 438/109, 455; 206/710, 454, 509
See application file for complete search history.

(56) References Cited

U.S. PATENT DOCUMENTS

| | | | | |
|---|---|---|---|---|
| 4,778,326 A * | 10/1988 | Althouse et al. | ............... | 414/800 |
| 5,545,283 A * | 8/1996 | Collins et al. | ................. | 156/382 |
| 5,590,787 A * | 1/1997 | Hodges | .......................... | 206/724 |
| 5,656,548 A * | 8/1997 | Zavracky et al. | ............... | 438/23 |
| 6,509,206 B2 * | 1/2003 | Iwasaki et al. | ................. | 438/107 |
| 7,077,908 B2 * | 7/2006 | Nogiwa et al. | ................. | 118/500 |
| 7,588,150 B2 * | 9/2009 | Kasama | ......................... | 206/710 |
| 7,632,374 B2 * | 12/2009 | Ozono et al. | .................... | 156/344 |
| 7,797,855 B2 * | 9/2010 | Fukuoka et al. | .................... | 34/78 |
| 2003/0086775 A1 | 5/2003 | Farassat | ......................... | 414/403 |
| 2005/0002763 A1 * | 1/2005 | Kampf et al. | ................. | 414/403 |
| 2005/0064680 A1 * | 3/2005 | Thallner | ....................... | 438/455 |
| 2005/0221722 A1 * | 10/2005 | Cheong | .......................... | 451/28 |
| 2007/0272991 A1 * | 11/2007 | Zakel et al. | .................... | 257/414 |
| 2007/0292248 A1 * | 12/2007 | Thallner | ......................... | 414/403 |
| 2007/0296035 A1 * | 12/2007 | George et al. | ................. | 257/347 |
| 2008/0008565 A1 * | 1/2008 | Thallner | ..................... | 414/217.1 |
| 2009/0158947 A1 * | 6/2009 | Thallner | ......................... | 101/333 |
| 2009/0258583 A1 * | 10/2009 | Thallner | ......................... | 451/289 |
| 2010/0071847 A1 * | 3/2010 | Shin et al. | ...................... | 156/285 |

FOREIGN PATENT DOCUMENTS

| | | |
|---|---|---|
| AT | 405 775 | 11/1999 |
| DE | 103 44 113 | 5/2005 |
| JP | 2004256793 | 9/2004 |

OTHER PUBLICATIONS

Packages and Packing Publication, Revision A (Mar. 1, 2003), Chapter 11, Die and Wafer Shipments, pp. 11-1 to 11-10.

* cited by examiner

*Primary Examiner* — Lee D Wilson
*Assistant Examiner* — Jamal Daniel
(74) *Attorney, Agent, or Firm* — Kusner & Jaffe

(57) ABSTRACT

The invention relates to a device having a first holding instrument (1) for a first wafer (5) and having a second holding instrument (7) for a second wafer (9) arrangeable parallel to the first wafer (5), the two holding instruments (1, 7) being fixable relative to one another. According to the invention, at least one of the holding instruments (1, 7), preferably both holding instruments (1, 7) respectively, comprises at least one gel film (2, 8) for holding the associated wafer (5, 9). The invention furthermore relates to the use of a gel film for holding integral wafers.

11 Claims, 1 Drawing Sheet

METHOD FOR HOLDING WAFERS AND DEVICE FOR FIXING TWO PARALLEL ARRANGED WAFERS RELATIVE TO ONE ANOTHER

FIELD OF THE INVENTION

The invention relates to a device for fixing two parallel arranged wafers relative to one another, and to a method for holding wafers.

BACKGROUND OF THE INVENTION

In semiconductor technology, it is conventional to fix wafers for various processing steps i.e. to fasten them on corresponding holding instruments. One method often used for holding wafers is to suction the wafers by means of a vacuum and release them from the fixture by applying atmospheric pressure after processing. Methods are furthermore known in which wafers are held on holding instruments by using wax. Other methods employ special adhesive films which lose their adhesive properties, and therefore make it possible to release the wafers, when a particular temperature is exceeded. Methods are also known in which wafers are fixed on adhesive films in order to be diced in a subsequent sawing process. In this case, the sawed subsections remain adhering on the adhesive film. It is furthermore known to employ an adhesive gel film in order to hold wafer subsections on a holding instrument for further processing.

Devices for fixing two wafers relative to one another are furthermore known in which so-called spacers, a type of wedge, are inserted between two wafers arranged mutually parallel and are mechanically fixed on the edges of the wafers, as disclosed for example in the Applicant's DE 103 44 113 A1. The known devices have significant disadvantages. The gap between the wafers is extremely narrow, so that it is difficult to form a vacuum between the two wafers in a subsequent processing step, particularly when using large wafers with a diameter of about 300 mm. A further disadvantage is that misalignment of the two wafers can occur when the spacers are removed. In addition, the edge regions of the wafers may be damaged by the use of spacers which clamp the edges.

SUMMARY OF THE INVENTION

It is an object of the invention to provide an alternative, non-aggressive method for holding wafers which have not been diced, as well as a device operating according to this method, with which damage to the wafers is avoided.

This object is achieved by the features of Claims 10 and 1, respectively. Advantageous refinements of the invention are specified in the dependent claims.

The invention is based on the concept of an adhesive gel film, which is conventionally used for holding wafer subsections, being provided with a gel layer in particular with a thickness of from 10 µm to 1000 µm, preferably about 165 µm, for holding whole i.e. integral wafers. In particular, PDMS-based material is suitable as the gel layer. The use of such films with a gel layer has the advantage that the wafers are not only held, but also simultaneously planarised. Using the gel film, in particular, very thin wafers which have the property of curling up can be fixed flat. The inventive use of a gel film for holding wafers is suitable particularly for process steps in which the wafers are processed with the application of a vacuum, i.e. it is only limitedly possible to fix the wafers by means of a vacuum for lack of a counter-pressure.

The device according to the invention comprises two holding instruments for fixing two wafers relative to one another. According to the invention, at least one of the two holding instruments now has a gel film for holding the associated wafer, Preferably both holding instruments are respectively equipped with at least one gel film, so that the two wafers are respectively held on a gel film and preferably simultaneously planarised. The gel films are in this case arranged mutually parallel, in order to allow parallel fixing of the wafers relative to one another.

According to a preferred configuration of the invention, the holding instruments are fixed relative to one another via clamping means.

In a refinement of the invention, these clamping means comprise at least one spring, preferably at least one spiral spring. The clamping means are preferably assigned to one of the two holding instruments and clamp the respective other holding instrument in a defined relative position. In one configuration of the invention, the clamping means comprise at least one plunger which is adjustable perpendicularly to the first holding instrument, i.e. along a Z axis, or in other words at least one spacer. A spring force is applied to the plunger in the direction of the first holding instrument by an aforementioned spring, preferably a spiral spring, so that the plunger is pressed against the first holding instrument by the spring force. In order to generate a clamping effect, a counter-element is provided which engages on the opposite side of the first holding instrument from the plunger, so that the first holding instrument can be received in a clamping fashion between the plunger and the counter-element.

The clamping means are preferably dimensioned so that a predetermined distance is maintained between the holding instruments, i.e. between the gel films. The defined distance ensures a defined gap between the wafers held on the gel films. This gap is preferably dimensioned so that a vacuum can be formed between the opposing wafers aligned mutually parallel.

According to a refinement of the invention, aligning means are provided for aligning the holding instruments with respect to one another. For example robot arms may be provided as the aligning means, which need not necessarily be part of the fixing device. By means of the aligning means, the holding instruments can be displaced relative to one another in their parallel plane, i.e. along an X axis and a Y axis, that is to say perpendicularly to the Z axis. Aligning is possible only when the first holding instrument is not clamped by the clamping means. The aligning is preferably carried out by moving the first holding instrument, while the second holding instrument is fixed in a defined position. To this end, the second holding instrument preferably comprises openings, into which stationary fixing pins can be inserted. The first holding instrument can be displaced, in particular by means of a robot arm, relative to the second holding instruments position uniquely determined in this way. After alignment, the first holding instrument is clamped by the clamping means.

According to one configuration of the invention, the first holding instrument is preferably fixed so that the gel film with the wafer fastened thereon can be adjusted perpendicularly in the direction of the second holding instrument, and therefore in the direction of the second wafer, by applying a pressure to the first holding instrument. To this end, according to one configuration of the invention, the first holding instrument comprises a frame on which a rigid element, carrying the gel film, is fixed with the aid of at least two resilient bands. Four symmetrically arranged, in particular identically designed bands are preferably used. By extension of the bands, the distance between the two wafers can be overcome. The bands must be shaped and arranged so that uniform extension of all the bands is possible, in order to avoid tilting the wafer during the movement in the direction of the second wafer. It is conceivable to design the frame rectangularly and to arrange the bands in the corners of the frame, so that they have an angular offset of 90° from one another. It is conceivable to provide merely three bands, which are arranged respectively offset from one another by 120° in the circumferential direction. The frame is not only used to fix the bands, but can also be clamped by the clamping means.

The device according to the invention is preferably configured as a transportable unit, so that it can be transported to different processing stations. During the transport, in particular by means of a robot, the two holding instruments and therefore the two wafers remain fixed relative to one another.

BRIEF DESCRIPTION OF THE DRAWINGS

Further advantages and expedient embodiments of the invention can be found in the further claims, the description of the figures and the drawings, in which:

In the figures, components which are the same and components with the same function are denoted by the same reference numerals.

DETAILED DESCRIPTION OF THE INVENTION

The figures show a device for fixing a first wafer 5 parallel and relative to a second wafer 9.

Figure 2:
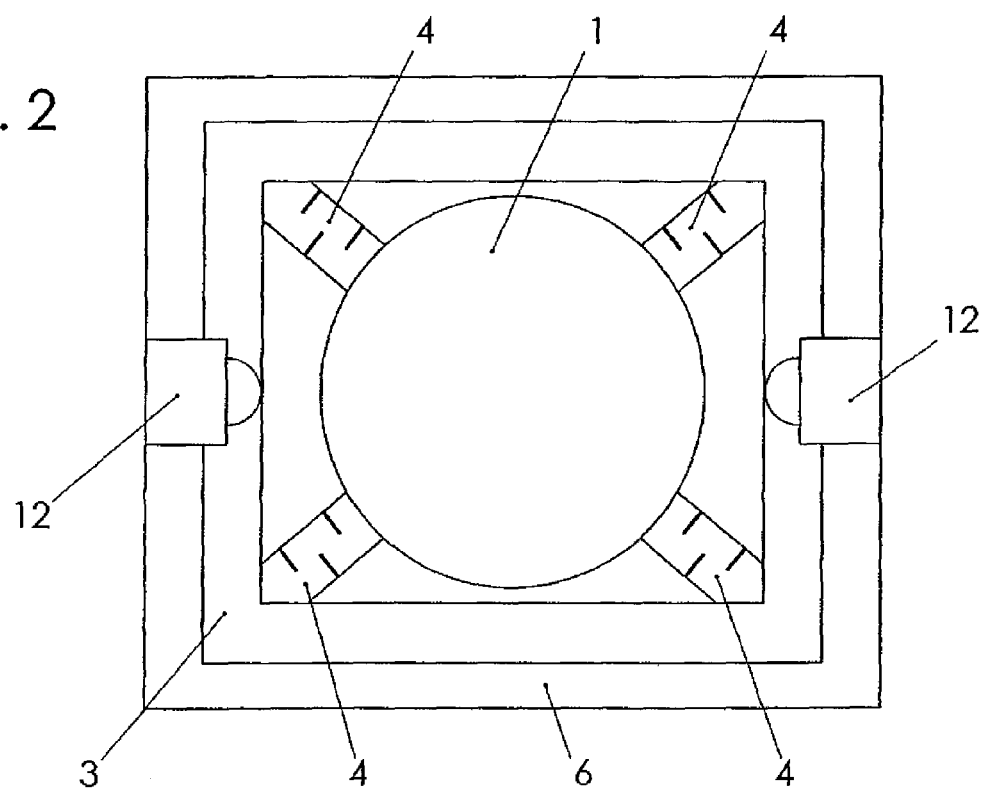
FIG. 2 shows a plan view of the device according to FIG. 1.

The device comprises a first holding instrument 1, in this exemplary embodiment the upper holding instrument, which is equipped with a first gel film 2. The first wafer 5 adheres on the gel film 2, and is simultaneously planarised owing to the gel layer of the gel film 2. The holding instrument 1 comprises a rectangular frame 3, which is represented as a circumferential frame in the plan view in FIG. 2. The rigid element, denoted by the reference numeral 1, carrying the gel film 2 is tensioned inside the frame 3 by four resilient identically designed resilient elements 4 configured as steel bands. The resilient elements 4 are fastened in the four corners of the frame 3 and extend radially in the direction of the holding instruments element denoted by the reference numeral 1. The identically designed resilient elements 4 have the same spring constant and are arranged symmetrically, respectively offset from one another by a circumferential angle of 90°. In this way, it is possible to move the holding instrument's element, denoted by 1, perpendicularly in the direction of the second wafer 9 without tilting it.

The device furthermore comprises a second holding instrument 7 with a second gel film 8, which is arranged parallel to the first gel film 2 of the first holding instrument 1. The second wafer 9 is held securely and immovably by the second gel film 8. The second holding instrument has a base body 6, which is used to hold clamping means, The clamping means comprise two plungers 10, anchored inside the base body 6 and adjustable in height via a screw thread in the base body, which are designed so that they are widened at their free end. The plungers 10 are guided, displaceably along a Z axis, inside a counter-element 12. The free ends of the plungers 10 press respectively via a spiral spring 13 on the counter-element 12 so that a spring force is applied in the direction of the first holding instrument 1 onto the plungers 10, with the second holding instrument 7 fixed thereto via the base body 6. As revealed in particular by FIG. 1, the counter-element 12 engages behind the circumferentially closed frame 3. The frame 3 can thereby be clamped between the plungers 10 and the counter-element. For the sake of clarity, a gap in the Z direction is shown between the plungers 10 and the frame 3 as well as between the frame 3 and the counter-element 12. This will of course be overcome by the springs 13, so that the plungers 10 and the counter-element 12 bear directly on the frame 3. In the fixed i.e. clamped state, a defined gap 11 in the Z direction is maintained between the two wafers 5, 9. The gap width can be influenced via the choice of length of the plungers 10.

Figure 1:
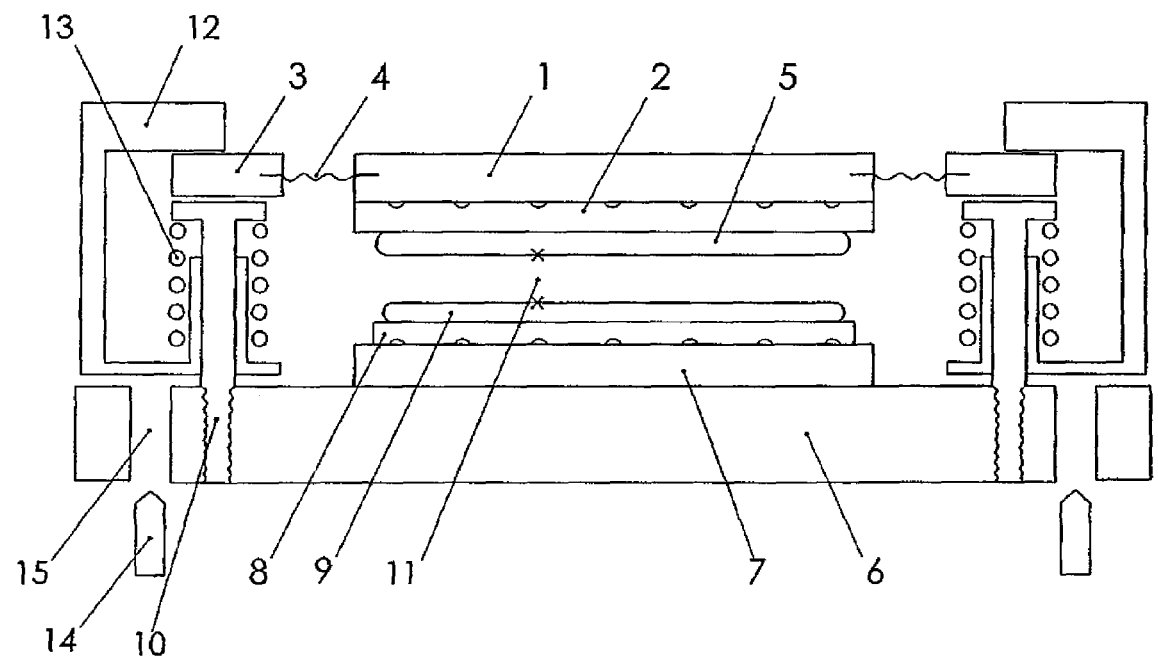
FIG. 1 shows a schematic side view of a device for fixing two wafers.

In order to align the two wafers 5, 9 relative to one another along an X axis and a Y axis, the clamping effect between the plungers 10 and the counter-element 12 must be negated. To this end pins, shown in FIG. 1, are provided which raise the counter-element 12 against the spring force of the springs 13 through the openings 15 of the base body 6, and thereby relieve the clamping pressure of the frame 13. As an alternative, the base body 6 may be moved by an instrument (not shown) away from the first holding instrument 1 in the Z direction against the spring force of the springs 13. The first holding instrument 1 with its frame 3 is thereby adjustable along the X axis as well as the Y axis, in particular by means of a robot. So that the second holding instrument 7 occupies a defined position during the alignment, two static pins 14 are provided onto which the base body 6 is driven via two corresponding openings 15 during its movement along the Z axis. The second holding instrument 7 therefore lies in a predefined position, relative to which the first holding instrument 1 can be adjusted by lateral displacement. After alignment has been performed, the counter-element 12 or the base body 6 with the plungers 10 as well as the second wafer 9 is moved back into the clamping position, where the plungers 10 and the counter-element 12 receive the frame 3 between them in a clamping fashion. Displacement of the holding instruments 1, 7 relative to one another is now no longer possible in the X and Y directions. The relative position is also unchanged during transport of the device shown in FIG. 1. It is merely possible for the first holding instruments element, denoted by the reference numeral 1, to be adjusted perpendicularly along the Z axis in the direction of the second wafer 9 by applying a force. During this adjustment, the four resilient elements 4 yield simultaneously and uniformly and therefore safeguard the parallelism and the alignment position in the X and Y directions of the two holding instruments 1, 7 and therefore of the two wafers 5, 9 relative to one another.

DESCRIPTION OF THE REFERENCE NUMERALS 1 element of the first holding instrument
2 first gel film
3 frame
4 resilient elements
5 first wafer
6 base body
7 element of the second holding instrument
8 second gel film
9 second wafer
10 plunger
11 gap
12 counter-element
13 springs
14 pins
15 openings Having described the invention, the following is claimed:

1. A device for fixing a first wafer relative to a second wafer, said device comprising:
   a first holding instrument having a first holding element for holding the first wafer;
   a second holding instrument having a second holding element for holding the second wafer parallel to the first wafer,
   said first and second holding instruments being fixable relative to one another, wherein at least one of the first and second holding instruments includes a gel film carried on the associated holding element for holding the associated wafer to the holding instrument; and
   clamping means for fixing the first and second holding instruments relative to one another;
   wherein said clamping means comprises at least one spring.

2. A device according to claim 1, wherein the device is a transportable unit.

3. A device according to claim 1, wherein said clamping means comprise at least one spiral spring.

4. A device for fixing a first wafer relative to a second wafer, said device comprising:
   a first holding instrument having a first holding element for holding the first wafer;
   a second holding instrument having a second holding element for holding the second wafer parallel to the first wafer,
   said first and second holding instruments being fixable relative to one another, wherein at least one of the first and second holding instruments includes a gel film carried on the associated holding element for holding the associated wafer to the holding instrument; and
   clamping means assigned to the second holding instrument, wherein the clamping means comprises at least one plunger which is adjustable perpendicularly to the first holding instrument along a Z axis and to which a spring force can be applied in the direction of the first holding element, said first holding instrument clampable between the plunger and a counter-element of the clamping means.

5. A device according to claim 4, wherein when the first holding instrument is clamped, there is a defined distance between the first and second holding elements providing a defined gap between the wafers respectively held by the first and second holding instruments.

6. A device for fixing a first wafer relative to a second wafer, said device comprising:
   a first holding instrument having a first holding element for holding the first wafer;
   a second holding instrument having a second holding element for holding the second wafer parallel and opposite to the first wafer,
   said first and second holding instruments being fixable relative to one another, wherein at least one of the first and second holding instruments includes a gel film carried on the associated holding element for holding the associated wafer to the holding instrument; and
   aligning means for aligning the first and second holding instruments and thereby aligning the first and second wafers with respect to one another, along an X axis and/or a Y axis, thereby defining a gap between the wafers.

7. A device for fixing a first wafer relative to a second wafer, said device comprising:
   a first holding instrument having a first holding element for holding the first wafer;
   a second holding instrument having a second holding element for holding the second wafer parallel to the first wafer,
   said first and second holding instruments being fixable relative to one another, wherein at least one of the first and second holding instruments includes a gel film carried on the associated holding element for holding the associated wafer to the holding instrument,
   said first holding instrument including a circumferential frame, wherein the first holding element carrying the gel film is tensioned on the frame by at least two resilient elements.

8. A device according to claim 7, wherein said resilient elements have the same spring constant.

9. A device according to claim 7, wherein said resilient elements are symmetrically arranged.

10. A device according to claim 7, wherein said resilient elements are bands.

11. A device for fixing a first wafer relative to a second wafer, said device comprising:
    a first holding instrument having a first holding element for holding the first wafer,
    a second holding instrument having a second holding element for holding the second wafer parallel to the first wafer, said first and second holding instruments fixable relative to one another; and
    wherein at least one of the first and second holding instruments includes a gel film carried on the associated holding element for holding the associated wafer to the holding instrument, said first holding instrument comprising a frame, wherein the first holding element carrying the gel film is tensioned on the frame by at least two resilient elements.

* * * * *